United States Patent [19]

Traub

[11] 4,277,749

[45] Jul. 7, 1981

[54] INPUT CIRCUIT FOR ELECTRONIC INSTRUMENTS

[75] Inventor: Stefan Traub, Böblingen, Fed. Rep. of Germany

[73] Assignee: Hewlett-Packard Company, Palo Alto, Calif.

[21] Appl. No.: 13,713

[22] Filed: Feb. 21, 1979

[51] Int. Cl.³ .............................................. G01R 15/00
[52] U.S. Cl. .................................... 324/126; 328/165
[58] Field of Search ............................. 324/126, 128; 307/296 R; 328/165

[56] References Cited

U.S. PATENT DOCUMENTS 2,900,501  8/1959  Momberg .............................. 328/165

*Primary Examiner*—Ernest F. Karlsen
*Attorney, Agent, or Firm*—Edward L. Miller

[57] ABSTRACT

An input circuit for electronic instruments, particularly measuring instruments, has an input for an input signal with a DC and an AC component and has an output for connection to the electronic instrument. A direct current or direct voltage source is provided, and a compensating circuit compensates the DC component of the input signal in such a way that the AC component is isolated and presented at the output. The compensating circuit is basically an impedance network consisting of three resistors connected in a π-style with the two outer resistors being connected to direct voltage or direct current sources which are jointly variable in such a way that they cancel each other at the input and the DC component of the input signal can be compensated at the output.

6 Claims, 3 Drawing Figures

INPUT CIRCUIT FOR ELECTRONIC INSTRUMENTS

BACKGROUND OF THE INVENTION

To the inputs of electronic devices, particularly measuring instruments such as oscilloscopes, are often applied voltages having both a DC and an AC component. In many such instances it is only the AC component which is relevant to the measuring operation while the magnitude of the DC component is of no concern. To eliminate the DC component, a DC voltage is, in the input circuit of the electronic device, added to the input signal, said DC voltage having the same absolute magnitude as the DC component but the opposite polarity It is well known to use an analog summing amplifier with two inputs for this purpose. The input signal consisting of the DC and AC components is applied to one of the inputs, while the compensating DC voltage is applied to the other input. At its output, the amplifier supplies only the AC component of the input signal. In many cases, however, the absolute magnitude of the DC component of the input voltage is substantially greater than the amplitude of the AC component. Although only the AC component is of importance, the dynamic range of the summing amplifier must in such cases be adapted to the overall magnitude of the input signal. Moreover, it is necessary that the summing amplifier have a linear characteristic over the entire dynamic range and that any spurious signals be small not only with respect to the DC component but also with respect to the AC component of the input voltage.

The dynamic range of the summing amplifier can, of course, be reduced by connecting a voltage divider before it, but this reduces the AC component of the input signal in the same proportion as the DC component.

This imposes an a priori maximum limit on the voltage division ratio.

SUMMARY OF THE INVENTION

It is an object of the invention to provide an input circuit for electronic devices which is, through the use of simple components, capable of isolating the AC component of an input signal consisting of a DC and an AC component without currents or voltages being applied to the source of the input signal or to the electronic device and without influencing the input impedance of the input circuit.

According to the invention there is provided an input circuit for electronic instruments, particularly measuring instruments including an input for an input signal with a DC and an AC component, and an output for connection to the electronic instrument.

According to the invention, only passive components are required besides two voltage sources which would for practical reasons be of equal magnitude. The isolated AC component of the input signal can be fed into an input amplifier of the electronic device. The dynamic range of this input amplifier needs only to be adapted to the amplitude of the AC component.

DESCRIPTION OF THE PREFERRED EMBODIMENT

Figure 1:
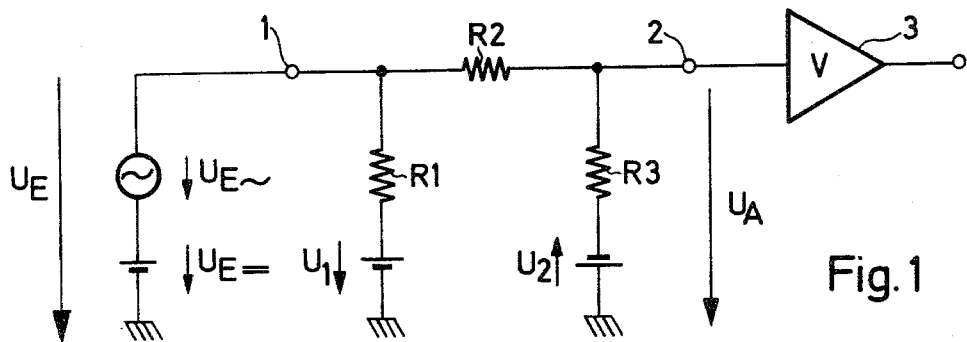
FIG. 1 shows a circuit according to the invention together with a preceding input voltage source and a subsequent AC voltage amplifier.

Referring now to FIG. 1, there are shown the input terminal 1 and output terminal 2 of an input circuit according to a preferred embodiment of the invention. In the simple embodiment shown in FIG. 1, the input circuit comprises the resistors $R_1$, $R_2$ and $R_3$ as well as two DC voltage sources $U_1$ and $U_2$.

At its input terminal 1, the input circuit shown is connected to a signal source which supplies the input voltage $U_E$. The input voltage $U_E$ is composed of a DC component $U_{E=}$ and an AC component $U_{E\sim}$.

At the output terminal 2 a voltage $U_A$ is output which, in the present example, is applied to an amplifier 3.

The voltage $U_A$ at the output terminal 2 of the input circuit according to the invention is calculated as follows:

$$U_A = (U_{E\sim} + U_{E=}) \frac{R_3}{R_2 + R_3} - U_2 \frac{R_2}{R_2 + R_3} \quad (1)$$
$$= K_1 U_{E\sim} + K_1 U_{E=} - K_2 U_2$$

If one wants to achieve that only the AC component of the input voltage $U_E$ is present at the output terminal 2, then the following must be true:

$$K_1 U_{E=} = K_2 U_2 \quad (2)$$

or $$U_2 = \frac{K_1}{K_2} U_{E=} = \frac{R_3}{R_2} U_{E=} \quad (3)$$

It can be seen that the DC component $U_{E=}$ of the input voltage $U_E$ can in all cases be compensated by selecting an appropriate voltage $U_2$.

Another condition to be fulfilled at the input terminal 1 is that no additional current is input to or output from the input signal source due to the voltage $U_2$. The additional compensation voltage $U_1$ is provided for this purpose. It is obvious that the above condition is, for instance, met if $U_1 = U_2$ and $R_1 = R_2 + R_3$. Therefore, the circuit according to FIG. 1 has the effect that the DC component of the input signal is compensated without this process causing any currents that would affect the input signal.

The resistors $R_2$ and $R_3$ act as a voltage divider for the AC component $U_E$. The voltage divider can be proportioned in accordance with the requirements of the input of the amplifier 3. In the simplest case, $R_2$ and $R_3$ will be of equal magnitude, thus dividing the amplitude of the AC component by two.

Figure 2:
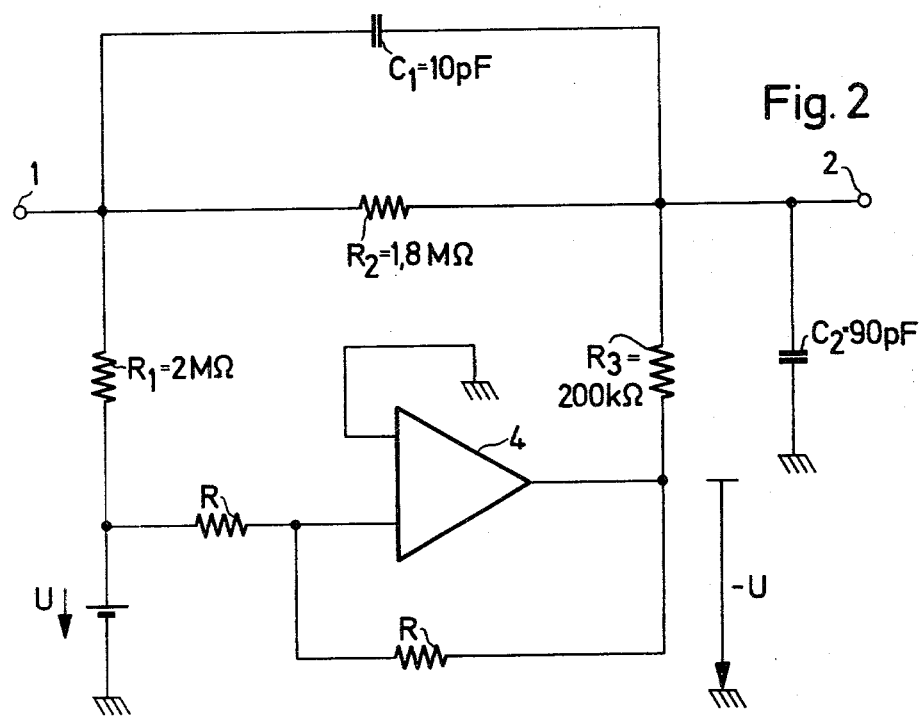
FIG. 2 shows a circuit according to the invention capable of also handling higher frequencies.

FIG. 2 represents a high-resistance input circuit which is also suited for higher frequencies of the input signal's AC component. The voltage division ratio is in this case 1/10. Connected in parallel with the voltage divider resistors $R_2$ and $R_3$ are the capacitors $C_1$ and $C_2$ which form a capacitive voltage divider with the same division ratio of 1/10 for higher frequencies. The voltage divider capacitors and resistors can be selected so that a standard impedance is present at the input terminal 1 if so desired.

FIG. 2 shows a simple way of generating the two opposed voltages U and −U (corresponding to the voltages $U_1$ and $U_2$ in FIG. 1). In the present example, only one voltage U is applied which is converted into the additional voltage −U using an inverter amplifier 4. Therefore, only one voltage, namely U needs to be changed to provide for adaptation to the DC component of the input signal. The voltage −U automatically varies with the voltage U.

Figure 3:
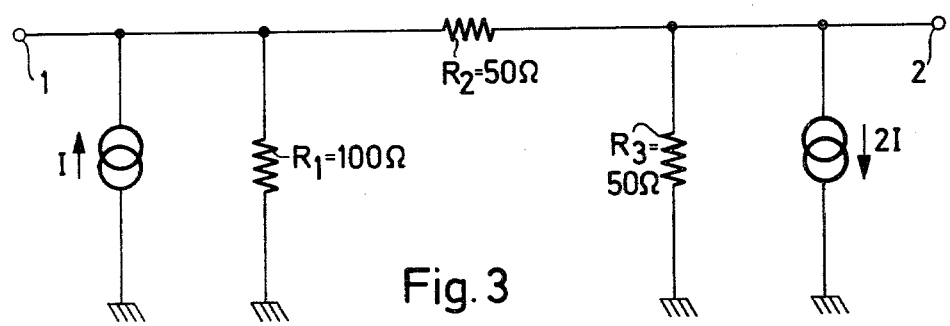
FIG. 3 shows a modification of the circuit according to the invention in a low-resistance version.

FIG. 3 illustrates a low-resistance input circuit wherein, as an alternative to the circuits according to FIGS. 1 and 2, the compensating voltage sources are replaced by current sources I and 2I. The input resistance at the input terminal 1 of this circuit is 50 ohms.

The current supplied by the current source 2I and applied to ground is drawn in two equal parts from the resistors $R_2$ and $R_3$. The current drawn from the resistor $R_2$ is supplied by the current source I. This ensures that no current is input or output via the input terminal 1 except the one supplied by the input signal itself. Similar to the examples in FIGS. 1 and 2, the currents I and 2I are adjusted so that the direct voltage component and direct current component, respectively, of the input signal are compensated, depending on whether the electronic device connected to the output terminal 2 is designed for measuring voltages or currents.

I claim:

1. An electrical circuit to compensate for the DC component of an input signal referenced to a signal ground, comprising:

first voltage supply means for supplying a first voltage referenced to the signal ground;

a first resistance connected at one end to the first voltage and connected at its other end to the input signal;

a second resistance connected at one end to the other end of the first resistance;

second voltage supply means for supplying a second voltage referenced to the signal ground and which is of the opposite polarity and the same magnitude as the first voltage; and a third resistance connected at one end to the other end of the second resistance and at the other end to the second voltage, having a resistance equal to the first resistance minus the second resistance, whereby the DC component of the input signal is absent from the compensated signal present at the junction of the second and third resistances.

2. An electrical circuit as in claim 1, further comprising a measurement means connected to the junction of the second and third resistances for receiving the compensated input signal.

3. An electrical circuit as in claim 1, wherein the second resistance is shunted by a first capacitance, the third resistance is shunted by a second capacitance, and the ratio of the second capacitance to the first capacitance is equal to the ratio of the second resistance to the third resistance.

4. An electrical circuit as in claim 1, wherein the second voltage supply means includes inverting amplifier means for generating the second voltage in response to the first voltage.

5. An electrical circuit to compensate for the DC component of an input signal referenced to a signal ground, comprising:

first current supply means, referenced to the signal ground, for supplying a first current;

a first resistance connected at one end to the signal ground and at the other end to both the input signal and to the first current supply means;

a second resistance connected at one end to the other end of the first resistance;

a third resistance connected at one end to the signal ground and at the other end to the other end of the second resistance, having a resistance equal to the first resistance minus the second resistance; and second current supply means, referenced to the signal ground and connected to the junction of the second and third resistances, for supplying a second current which is of the opposite polarity and twice the magnitude of the first current, whereby the DC component of the input signal is absent from the compensated signal present at the junction of the second and third resistances.

6. An electrical circuit as in claim 5, further comprising a measurement means connected to the junction of the second and third resistances for receiving the compensated input signal.

* * * * *